(12) United States Patent
Wang et al.

(10) Patent No.: US 10,609,871 B1
(45) Date of Patent: Apr. 7, 2020

(54) LIGHTING DEVICE FOR HORTICULTURAL FACILITY

(71) Applicants: Tiejun Wang, Lin'an (CN); Dengke Cai, Willoughby, OH (US)

(72) Inventors: Tiejun Wang, Lin'an (CN); Dengke Cai, Willoughby, OH (US)

( * ) Notice: Subject to any disclaimer, the term of this patent is extended or adjusted under 35 U.S.C. 154(b) by 0 days.

(21) Appl. No.: 16/111,467

(22) Filed: Sep. 17, 2018

(51) Int. Cl.
*F21V 15/01* (2006.01)
*A01G 7/04* (2006.01)
*H05K 3/32* (2006.01)
*F21V 29/74* (2015.01)
*H05K 1/02* (2006.01)
*H05B 45/20* (2020.01)
*F21V 3/06* (2018.01)

(52) U.S. Cl.
CPC ............... *A01G 7/045* (2013.01); *F21V 15/01* (2013.01); *F21V 29/74* (2015.01); *H05B 45/20* (2020.01); *H05K 1/0203* (2013.01); *H05K 3/32* (2013.01); *F21V 3/061* (2018.02); *H05K 2201/10106* (2013.01)

(58) Field of Classification Search
CPC .. F21V 29/74; H05B 33/0857; H05B 33/0845
See application file for complete search history.

(56) References Cited

U.S. PATENT DOCUMENTS

| 9,243,777 B2 | 1/2016 | Donofrio et al. |
| 9,657,922 B2 | 5/2017 | Negley et al. |
| 2016/0097497 A1 | 4/2016 | Benner et al. |
| 2017/0006685 A1* | 1/2017 | Barron ............... H05B 33/0869 |
| 2017/0261181 A1 | 9/2017 | Cai et al. |
| 2018/0110102 A1* | 4/2018 | Adams ....................... F21V 5/04 |
| 2018/0135830 A1* | 5/2018 | Cai ............... F21K 9/64 |
| 2018/0156420 A1 | 6/2018 | Dudik et al. |
| 2019/0075735 A1* | 3/2019 | Ma ......................... A01G 9/023 |

FOREIGN PATENT DOCUMENTS

| AU | 2017251855 A1 | 11/2017 |
| CN | 106398157 A1 | 2/2017 |
| WO | 2016057604 A1 | 4/2016 |

OTHER PUBLICATIONS

Anant k Setlur, Phosphors for LED-based Solid-State Lighting, The Electrochemical Society Interface, Winter 2009.

* cited by examiner

*Primary Examiner* — Anne M Hines
(74) *Attorney, Agent, or Firm* — Daniel M. Cohn; Howard M. Cohn

(57) ABSTRACT

A lighting device for supporting plant-growth includes an LED driver that inputs a high-voltage AC driver-input current. The driver outputs a driver-output current at a stepped driver-output voltage. LEDs are powered by the driver-output current. The LEDs include deep-red LEDs that output a first number W1 of radiation watts of a deep-red light band at 660 nm, far-red LEDs that output a second number W2 of radiation watts of a far-red light band at 730 nm, and white-light LEDs that output a third number W3 of radiation watts of white light having a color rendering index (CRI) of less than 75. W3 is greater than the sum L1+L2. At least 3% of all radiation output by the LEDs is at or above 700 nm.

20 Claims, 9 Drawing Sheets

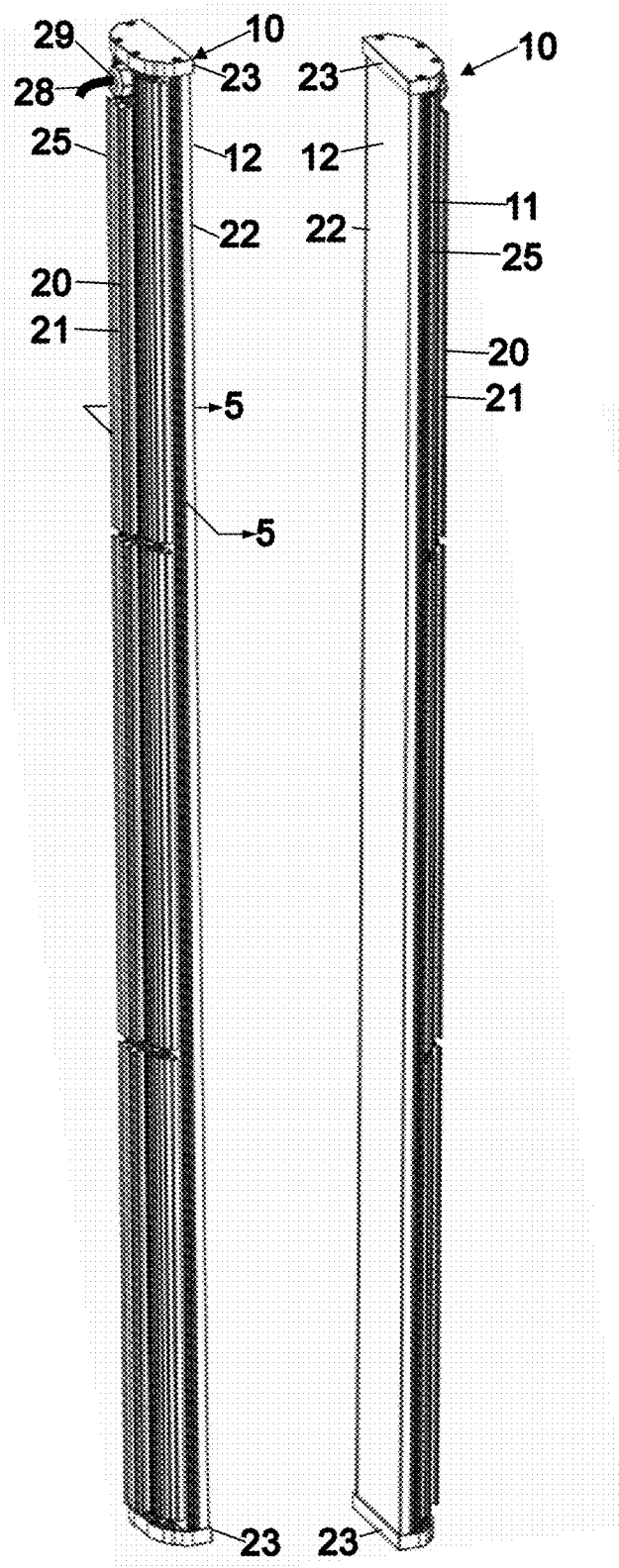
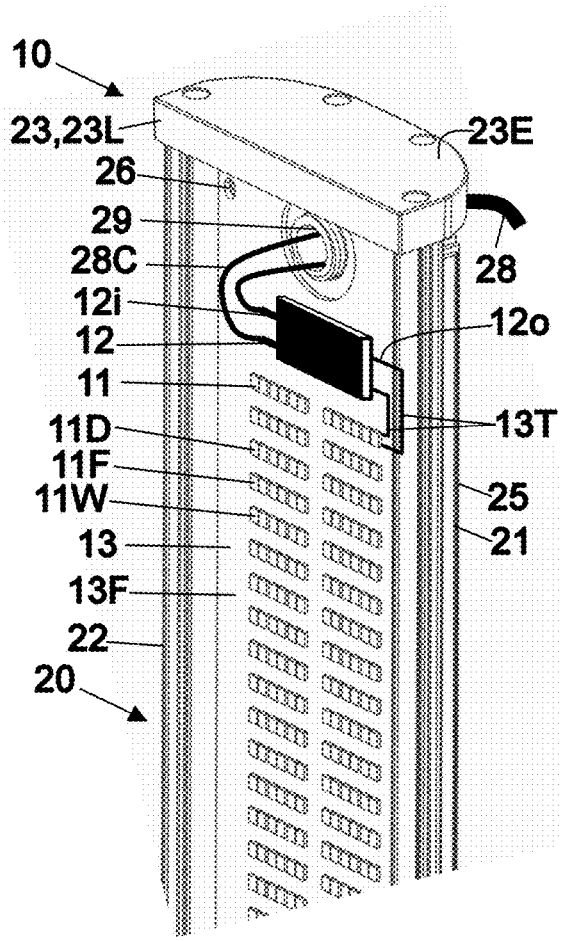
FIG.1  FIG.2
FIG.3

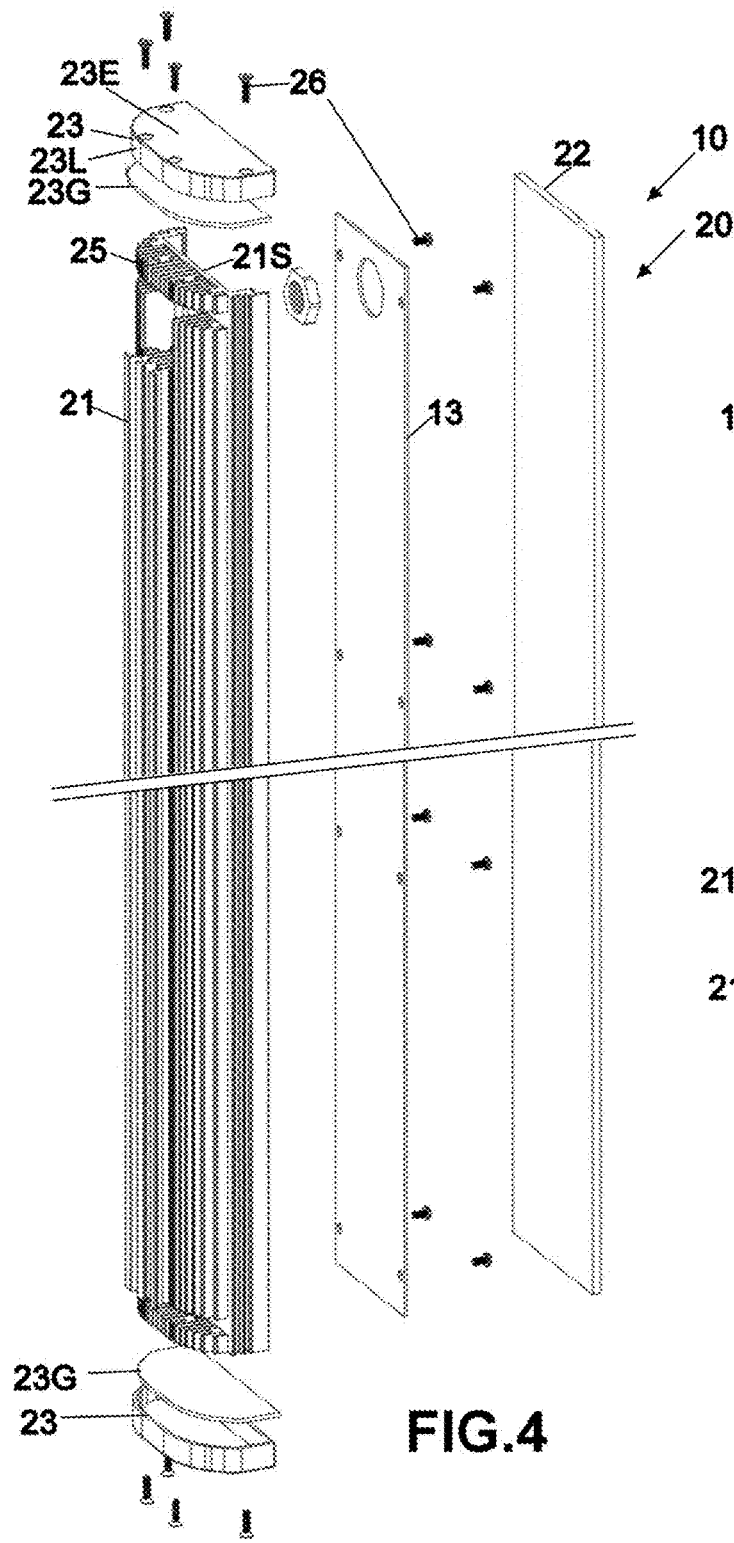
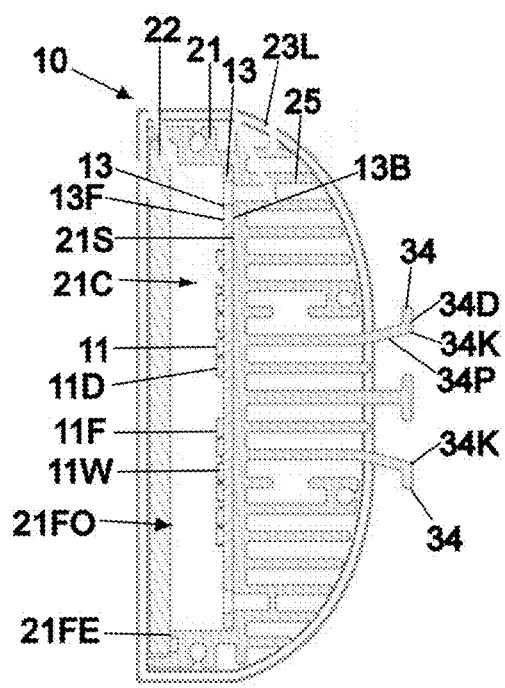
FIG.4
FIG.5

US 10,609,871 B1

LIGHTING DEVICE FOR HORTICULTURAL FACILITY

FIELD OF THE INVENTION

This invention relates to the field of lighting devices for supporting plant growth in horticultural facilities.

BACKGROUND

Grow lights are artificial light sources configured to provide light to plants for horticulture. Grow lights are typically electrically powered and provide light to support a plant's growth through photosynthesis and other photochemical processes during plant growth. Typical horticultural facilities use grow lights as both sole light in indoor growing facilities and supplemental light for greenhouses.

Supplemented greenhouses are enclosed by a light transmissive (transparent or translucent) material such as glass, rigid plastic and plastic film. The transmissive material admits sunlight into the greenhouse, so that plants in the greenhouse receive sunlight to promote photosynthetic growth (growth through photosynthesis). Electric lights, mounted above the plants, augment the hours of light and intensity of light provided to the plants, to promote growth.

In indoor growing facilities, plants are grown indoors, in a building structure with opaque walls. The plants therefore lack significant exposure to sunlight for plant growth. Substantially all of the light for plant growth is provided by grow lights that are mounted high above the plants. Indoor growing facilities are typically of two types—non-stacked and stacked.

In non-stacked indoor growing facilities, plants are typically grown in trays in a single layer, typically on a floor. Grow lights are suspended from the ceiling of the indoor growth facility.

In stacked indoor growing facilities, also called vertical indoor growing facilities, plants are typically grown in trays that are vertically stacked on vertical shelving from floor to ceiling. This stacked configuration provides more growing area per floorspace than the non-stacked indoor configuration. Grow lights are mounted above each of the stacked trays, and much closer to the plants than in the greenhouse configuration and non-stacked configuration.

SUMMARY

A lighting device is for supporting plant-growth. The device includes a one-piece circuit board. An LED driver is directly mounted on a front surface of the circuit board. The driver is configured to input a high-voltage alternating-current (AC) driver-input current. The driver is configured to, when the driver is powered by the driver-input current, output a driver-output current at a stepped driver-output voltage. A set of LEDs are directly mounted on the front surface of the circuit board and configured to be powered by the driver-output current. The set includes one or more deep-red LEDs configured to output, when powered by the driver, a first number W1 of watts of radiation of a band of deep-red light at 660 nm. The set further includes one or more far-red LEDs configured to output, when powered by the driver, a second number W2 of watts of radiation of a band of far-red light at 730 nm. The set further includes one or more white-light LEDs configured to output, when powered by the driver, a third number W3 of watts of radiation of white light having a color rendering index (CRI) of less than 75. W3 is greater than the sum L1+L2. At least 3% of all radiation output by the set of LEDs is at or above 700 nm.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 6:
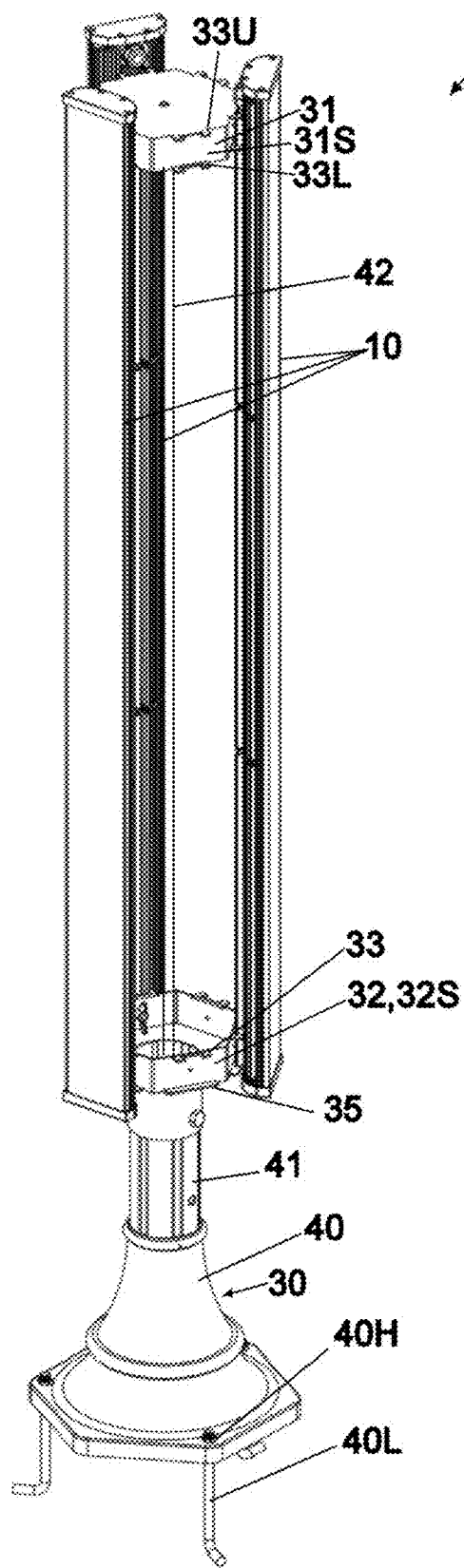

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

In the drawings:

FIGS. 1 and 2 are perspective view of an example lighting device.

FIG. 3 is an expanded view of a section shown in FIG. 2.

FIG. 4 is an exploded view of the lighting device shown in FIG. 2.

FIG. 5 is a sectional view of the lighting device taken at line 5-5 of FIG. 1.

FIG. 6 is a perspective view of a lighting apparatus that includes multiple lighting devices, like the lighting device of FIG. 1, oriented in different directions.

Figure 7:
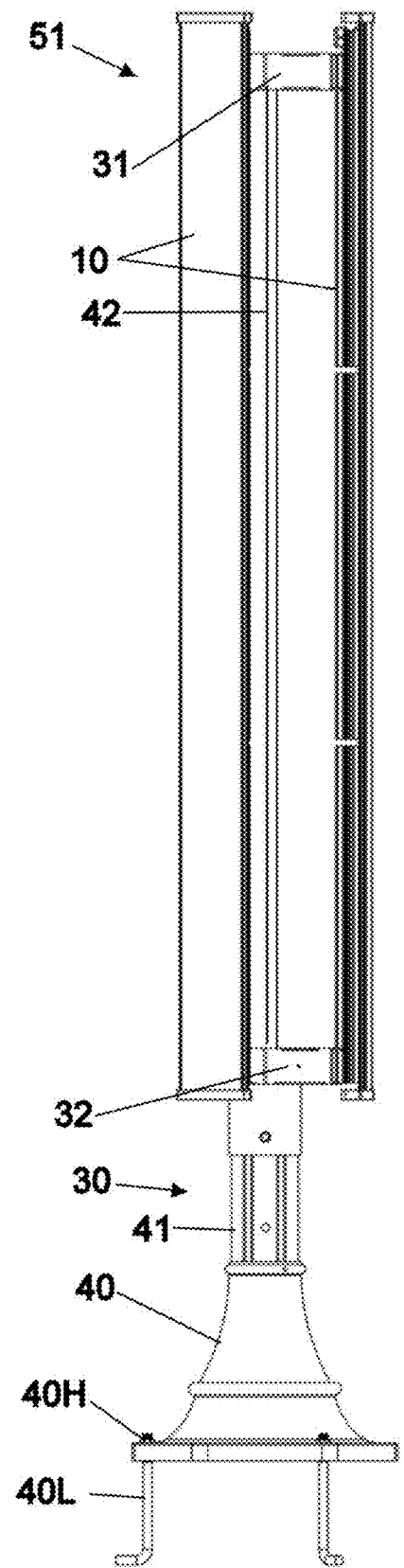

FIG. 7 is a side view of the lighting apparatus of FIG. 6.

Figure 8:
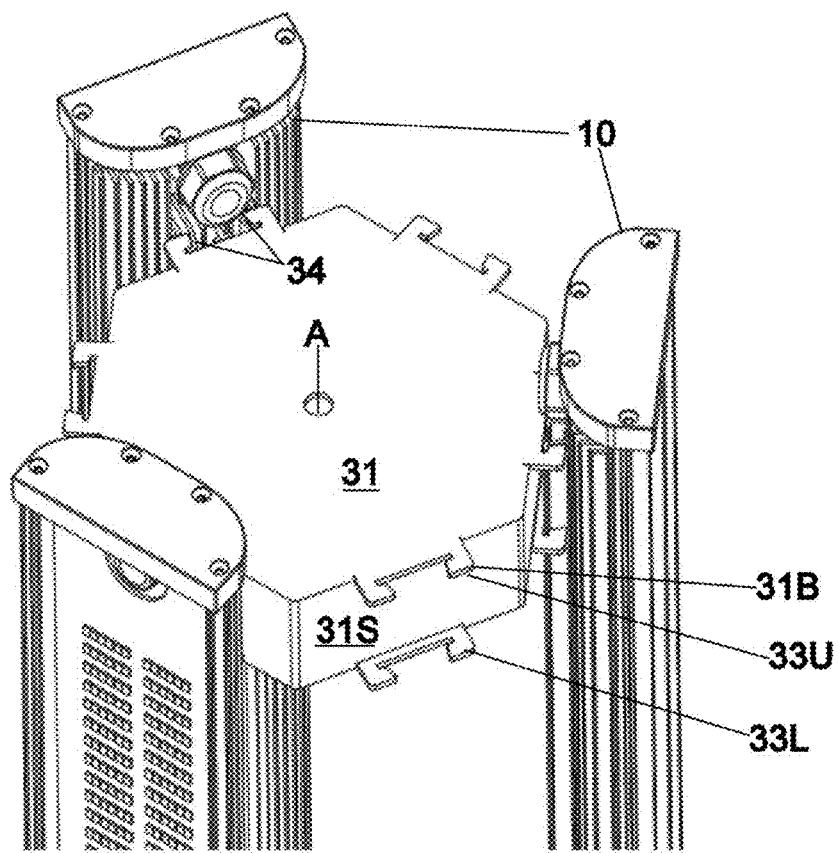

FIG. 8 is an expanded perspective view of an upper section of the lighting apparatus shown in FIG. 6.

Figure 9:
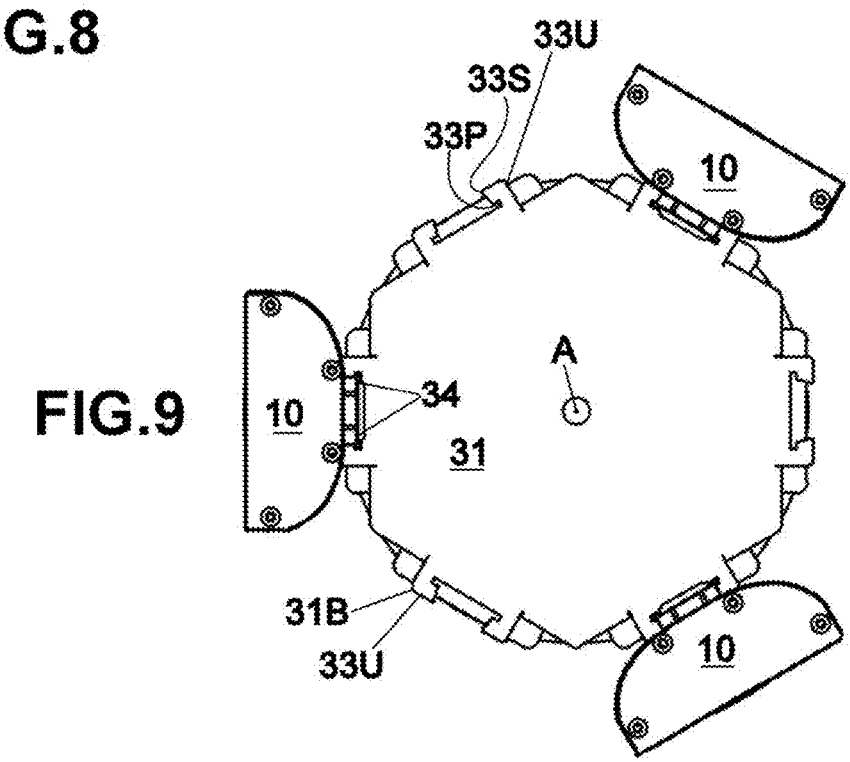

FIG. 9 is a top view of the upper section shown in FIG. 8.

Figure 10:
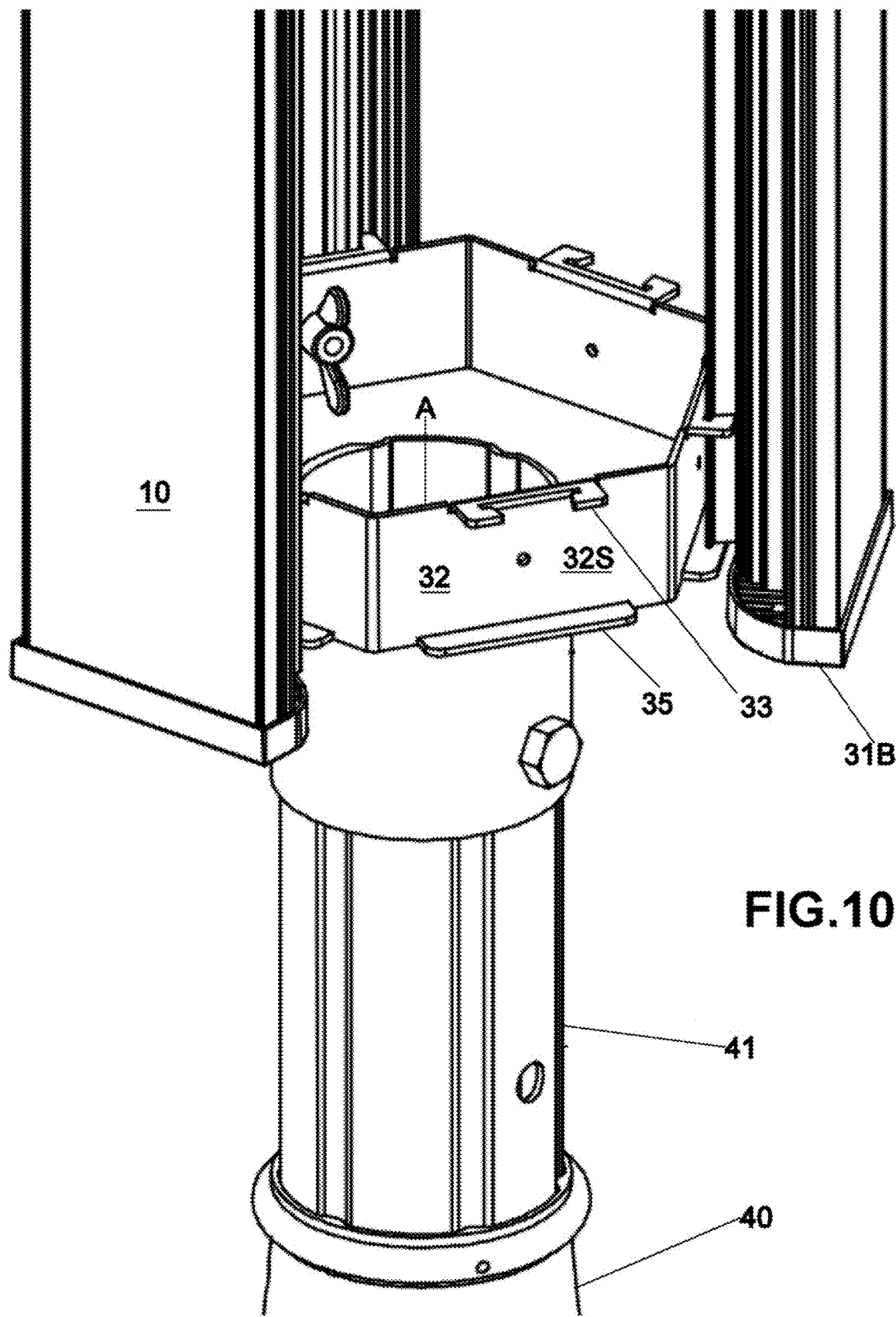

FIG. 10 is an expanded perspective view of a lower section of the lighting apparatus shown in FIG. 6.

Figure 11:
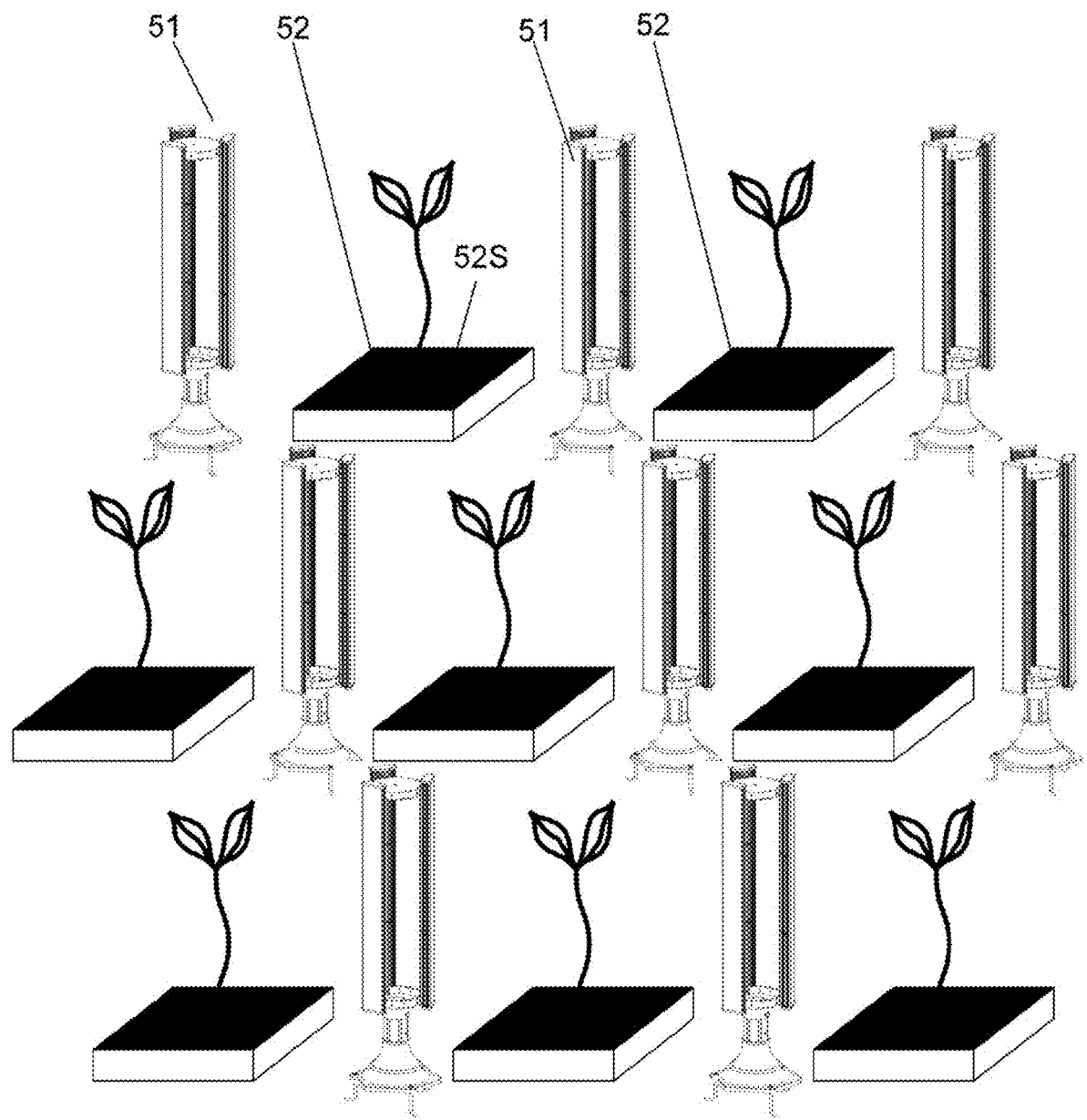

FIG. 11 is a perspective view of an arrangement comprising lighting apparatuses, like the lighting apparatus of FIG. 6, interspersed between trays of growing plants, with each lighting apparatus having three lighting devices like the lighting device of FIG. 1.

Figure 12:
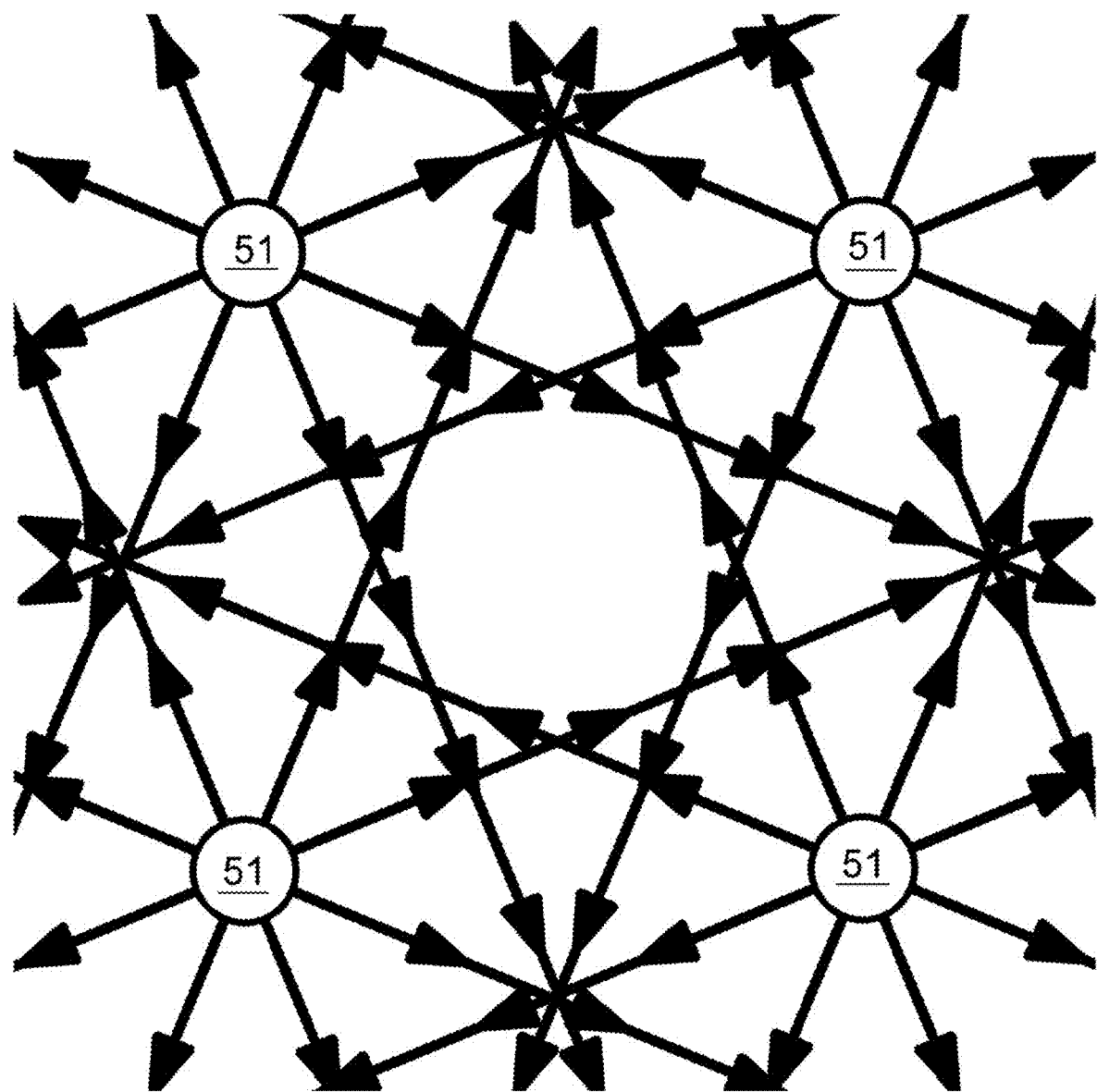

FIG. 12 is a diagrammatic top view of a pattern of beams of light that the arrangement of FIG. 11 might produce if each apparatus in the arrangement had six lighting devices like the lighting device of FIG. 1.

Figure 13:
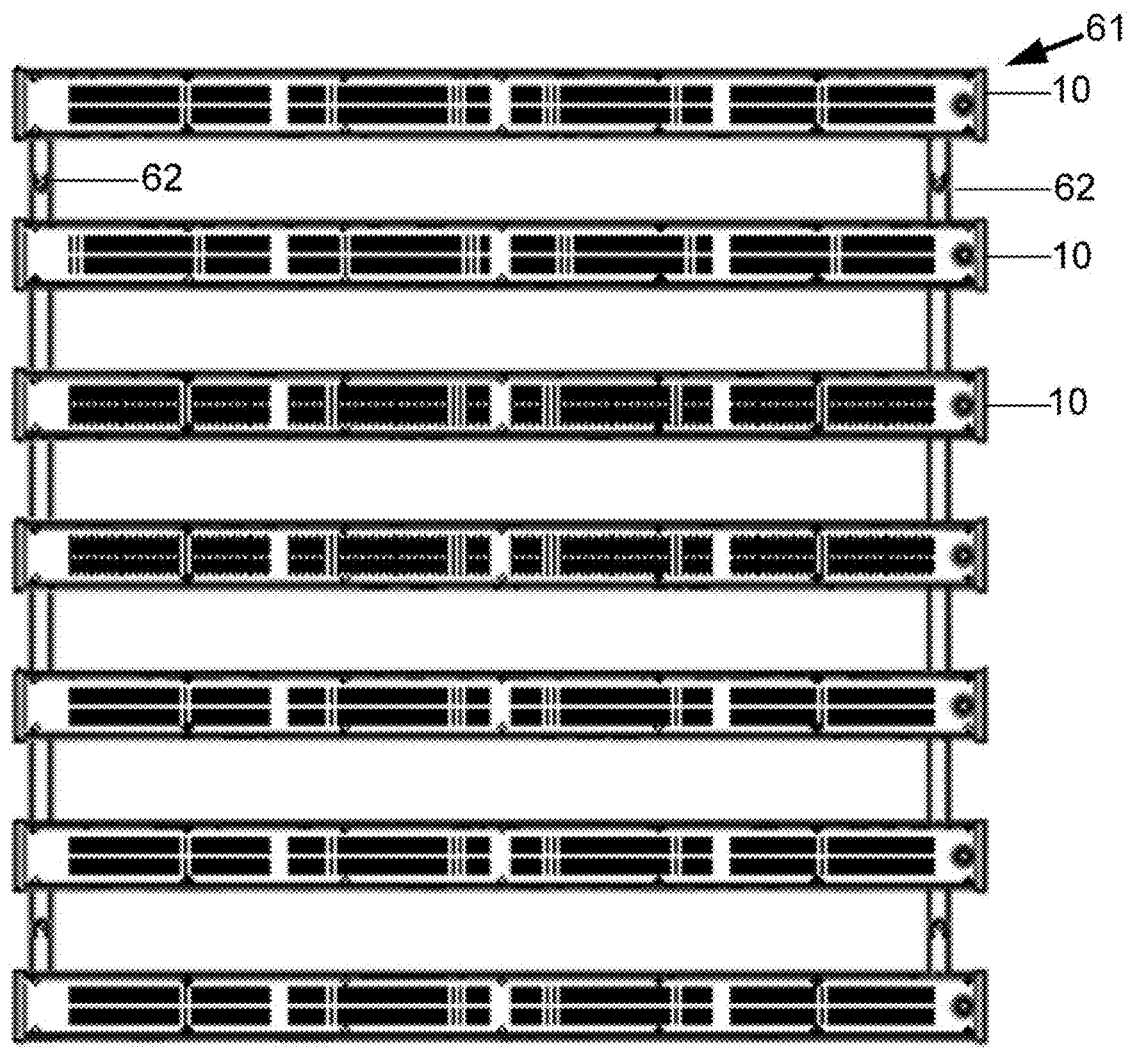

FIG. 13 is a plan view of a second lighting apparatus in which lighting devices, like the lighting device of FIG. 1, are oriented in the same direction.

Figure 14:
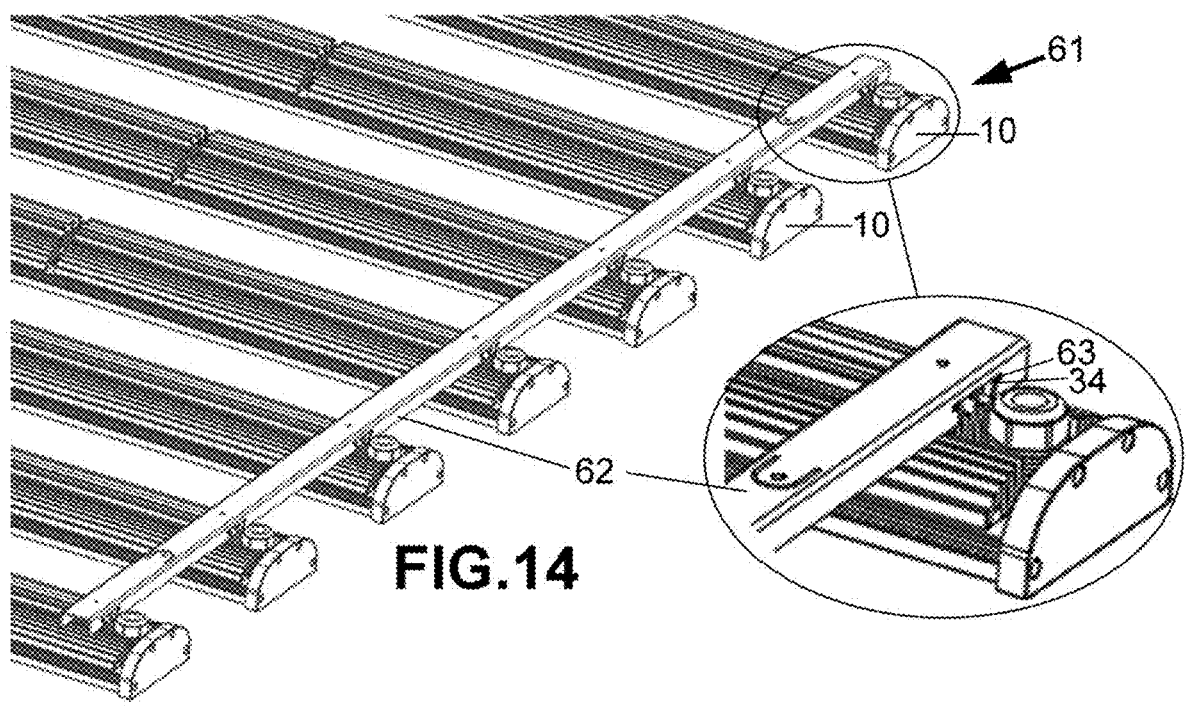

FIG. 14 is a rear perspective view of a section of the second lighting apparatus of FIG. 13.

Figure 15:
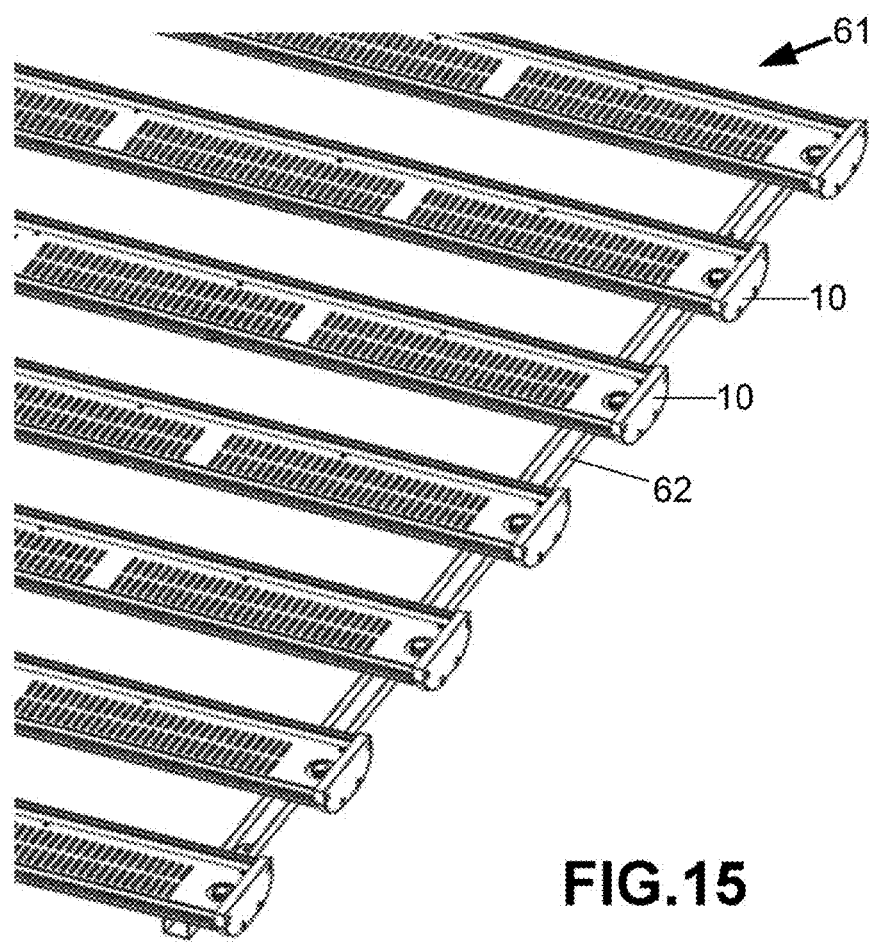

FIG. 15 is a front perspective view of a section of the second lighting apparatus of FIG. 13.

DETAILED DESCRIPTION

FIGS. 1-5 show an example lighting device 10 (lighting module). This device 10 is well suited for providing light to plants to promote (support) photosynthetic plant growth in a horticulture facility.

The example lighting device 10 includes a set of LEDs 11 (light emitting diodes) that are powered by a driver 12. The LEDs 11 and the driver 12 are directly mounted on a common circuit board 13. The circuit board 13 has a front surface 13F over which the LEDs 11 and the driver 12 are mounted, and an opposite rear surface 13R. The LEDs 11, driver 12 and circuit board 13 are hermetically enclosed in a housing 20 (casing) that comprises a rear cover 21, a light-transmissive (i.e., transparent or translucent) front cover 22, and two end caps 23.

The rear cover 21 in this example has a cavity 21C and a front opening 21FO surrounded by a forward-facing front edge 21FE (front surface). The rear cover 21 in this example is one-piece and of metal and includes metallic heat-dissipation fins 25 extending rearward.

The front cover 22 in this example is one-piece and formed of glass or fluoropolymer. The front cover 22 extends across the rear cover's front opening 21FO. The front cover 22 is fastened by fasteners 26 (in this example screws) to the rear cover's front edge 21F.

The circuit board 13 in this example is a metal core printed circuit board (MCPCB). Base metal material in the core of this type of printed circuit board (PCB) enables this type of PCB to dissipate heat more efficiently than PCBs without a metal core. The circuit board 13 is one-piece, in that it is not composed of circuit boards attached together. The circuit board's front surface 21F is overlaid by metallic traces 13T (including metallic pads) that conduct electricity between components that are mounted on the PCB 13. The LEDs 11 and the driver 12 are surface-mounted onto the circuit board's front face 13F, and are soldiered directly to the traces 13T that overlie the circuit board's front surface. The circuit board 13 is located within the rear cover's cavity 21C, with the circuit board's front surface 12F facing toward the front cover 22. The circuit board 13 is fastened by fasteners 26 (in this example screws) to an internal forward-facing surface 21S of the rear cover 21. Due to the fasteners 26, the rear cover 21 and the front cover 22 and the circuit board 13 are all fixed relative to each other.

In this example, substantially all of the circuit board's rear surface 12R is in physical contact with the rear cover's internal forward-facing surface 21S. This helps to maximizes heat-transfer between the circuit board 13 and the rear cover 21. Heat generated by the LEDs 11 and the driver 12 will flow (and thereby be dissipated) through the circuit board 13 and the rear cover's internal forward-facing surface 21R and the rear cover's fins 21F to the open air (atmosphere).

In this example, the rear cover 21 and the front cover 22, when fastened together, bound and define an end opening at each end of the housing 20. The end openings are sealed off by the end caps 23. The end caps 23 in this example have an end surface 23E surrounded by a lip 23L (skirt). The lip 23L is closed-loop and projects perpendicularly away from the end surface 23E. The end cap 23 includes an internal rubber (e.g., silicone rubber) gasket 23G. The end caps 23 are installed at opposite ends of the rear cover 21 and front cover 22. When installed, each cap 23, with its gasket 23G, seals the housing's respective end opening. The housing 20 is thus hermetically sealed by the combination of the front cover 21, the rear cover 22 and the end caps 23.

The driver 12 in this example has an input 12$i$ that is configured to receive a driver-input current at a driver-input voltage. The driver input 12$i$ is electrically connected to a flexible cable 28 (e.g., lamp cord) with two conductors 28C. The cable 28, with conductors 28C, projects through a hole 29 in the rear cover 21 to a location outside the housing 20. Internal ends (first ends) of the cable's two conductors 28C are soldered to the driver's input 12$i$ (e.g., PCB traces that lead to the driver 12). External ends (second ends) of the cable's two conductors 28C are connected to a source of high voltage AC (alternating-current) current, for example by being connected to a wall plug that is plugged into a wall socket or wall-voltage power strip or wall-voltage extension cord. The driver-input current (high voltage AC input current) received by the driver 12 is at a voltage (herein called driver-input voltage) that might be mains voltage (wall voltage), which might be at least 100 VAC. The mains voltage is typically 120 VAC, 208 VAC, 240 VAC and 277 VAC in the United States.

The driver 12 is in a powered state when it inputs the driver-input current at the driver-input voltage. When in the powered state, the driver 12 performs a voltage-conversion process on the driver-input voltage to output a driver-output current at a driver-output voltage through a driver output 12$o$ for driving the LEDs 11. The driver's voltage-conversion process, and its resulting driver-output voltage, might include one or more of the following examples. The magnitude of the driver-output voltage might be substantially the same (i.e., the same or within 10%) as the magnitude of the driver-input voltage. The magnitude of the driver-output voltage might be lower than the magnitude of the driver-input voltage. The voltage-conversion process might include full-bridge rectification of the driver-input voltage. The driver-output voltage might be a full-bridge-rectified signal (i.e., typically a sequence of contiguous half-waves that extend from zero voltage to a maximum positive peak voltage). Or the driver-output voltage might be filtered (such as by capacitor) to yield a smooth above-zero DC voltage. The driver-output voltage might vary in a stepped manner (e.g., repeatedly rising in a series of distinct steps and then falling in a series of distinct steps, as opposed to a smoothly-varying AC driver-input voltage). In the stepped-output example, the stepped output signal might be in-phase with a full-bridge-rectified and/or voltage-divided version of the AC driver-input voltage. The driver might be electrically connected to the LEDs in a configuration that enables the driver to apply the driver-output voltage to varying numbers of the LEDs in series, so that a number of in-series LEDs that the output voltage is being applied to is continuously adjusted to match (be appropriate for) the driver-output voltage. The driver's output 12$o$ in this example comprises conductors connected to traces (on the circuit board) that distribute the driver-output power (current) to the LEDs 11.

The LEDs 11 in this example include one or more deep-red LEDs 11D, one or more far-red LEDs 11F, and one or more white-light LEDs 11W. When the LEDs 11 are powered by the driver 12 while in the powered state, the deep-red LEDs 11D emit (output) a first number W1 (first amount of) of watts of radiation of a band of deep-red light with peak emission wavelength around 660 nm. Concurrently, the far-red LEDs 11F emit a second number W2 of watts of radiation of a band of far-red light with peak emission wavelength around 730 nm. And the white-light LEDs 11W emit a third number W3 of watts of radiation of bands that together comprise white light (with color temperature ranges from 1800 K to 7000 K). The white light has an overall color rendering index (CRI) of less than 75. That is because light having a lower CRI, such that it is less optimal for rendering objects for human viewing, is more efficient in generating light for plant growth, in terms of amount of radiated-power plant growth per electrical power consumed within PAR region (as explained below). W3 is more than the sum W1+W2. At least 3%, and perhaps even at least 5%, of all radiation-wattage output by the set of LEDs 11 is at or above 700 nm.

In this example, the circuit board 13 is elongated and has a length extending in a longitudinal direction and a width (smaller than the length) extending in a lateral direction. The lateral direction is perpendicular to the longitudinal direction. In this example, the set of LEDs 11 includes a plurality of the deep-red LEDs 11D, a plurality of the far-red LEDs 11F and a plurality of the white-light LEDs 11W. The LEDs are arranged in an array that is elongated in the longitudinal direction. At least one of the deep-red LEDs 11D is located between two far-red LEDs 11F and between two white-light LEDs 11W. At least one of the far-red LEDs 11F is located between two deep-red LEDs 11D and between two white-light LEDs 11W. At least one of the white-light LEDs 11W is located between two deep-red LEDs 11D and between two far-red LEDs 11F. Herein. "located between" includes the possibility of other LEDs and other electrical components intervening. This configuration of interspersing the LEDs among each other helps increase the emitted light's color uniformity along the length of the array of LEDs.

In operation, the driver 12 converts the high-voltage AC driver-input current to the driver-output current at the driver-output voltage. The LEDs 11 are powered by the driver-output current to emit light, which includes deep-red, far-red and white light covering significant emission from wavelength of 380 nm to 800 nm.

FIGS. 6-10 show an example lighting apparatus 51 comprising a support structure 30 and multiple lighting devices 10. Each of the lighting devices 10 (in FIGS. 6-10) is the same as the lighting device 10 (lighting module) of FIGS. 1-5.

The support structure 30 includes an upper bracket structure 31 and a lower bracket structure 32. The upper bracket structure 31 might be supported by a vertical rod 42 that is connected, directly or indirectly, to the lower bracket structure 32. The bracket structures 31, 32 are polygonal in that each bracket structure has multiple radially-outwardly-facing polygon surfaces 31S, 32S (faces), with a bracket 31B, 32B extending from each polygon surface 31S, 32S. For each bracket structure 31, 32, the polygon surfaces 31S, 32S and their respective brackets 31B, 32B are evenly spaced apart about a vertical central axis A (FIGS. 7-8). The number of polygon surfaces 31S, 32S and the number of brackets 31B, 32B is the same for the upper bracket structure 31 as for the lower bracket structure 32. The number of brackets 31B, 32B of each bracket structure 31, 32 might be two or three or more. In this example, the number of brackets of each bracket structure is six, such that the bracket structures 31, 32 are hexagonal.

As shown in FIGS. 5 and 7-8, each bracket 31B of the upper bracket structure 31 has an upper claw 33U that is spaced above and in alignment with a lower claw 33L. The upper and lower claws 33U, 33L have a common size and shape. Each claw 33U, 33L is configured to slidably grasp two of the lighting device's cover's fins, herein called attachment fins 34. Each attachment fin 34 has an L-shaped horizontal cross-section (i.e., with reference to being sectioned along a horizontal plane), comprising a rearwardly-extending proximal segment 34P (FIG. 5) and a distal segment 34D. The distal segment 34D is (in horizontal cross-section) substantially (somewhat) perpendicular to the proximal section 34P and is joined to an end of the proximal section 34P at a knee 34K (knee joint) and projects from the knee 34K in a direction away from the other attachment fin 34. Each claw 33 has slots 33S (FIG. 9) that slidably and closely receive the attachment fins' distal segments 34D. Each claw 33 further has pincer ends 33P that slidably and closely engage the attachment fins' proximal segments 34P (FIG. 5).

As shown in FIG. 10, each bracket 32B of the lower bracket structure 32 has a claw 33 that is the same size and shape as the claws 33U, 33L of the upper bracket structure 31 (FIG. 8). The claw 33 of the lower bracket structure 32 is thus configured to slidably grasp the two attachment fins 34 (FIG. 5) in the same manner as do the claws 33U, 33L of the upper bracket structure 31.

Each bracket 31B of the lower bracket structure 31 further has shelf 35 that is spaced below and in alignment with the claw 33. The shelf 35 is configured to support the attachment fins 34 (FIG. 5) and stop further downward movement of the attachment fins 34 when the attachment fins 34 are slid through the claws 33U, 33L, 33. When the attachment fins 34 rest on the shelf 35, the lighting device 10 has reached its installed position relative to the support structure 30.

As shown in FIGS. 6-7, the bracket structures 31, 32 in this example are rigidly supported on a base 40. The base 40 is somewhat conical, with a broader bottom and narrower top. A post 41 extends upward from the base 40 to the lower bracket structure 32. The bracket structures 31, 32 are thus supported on and by the base 40. The base 40 has three holes 40H in its bottom. An L-shaped rod 40L (bent rod) has a vertical proximal segment and a horizontal distal segment that a joined at a knee. The rod's vertical proximal segment extends through a corresponding one of the holes 40H and has a threaded top to which a nut is fastened. If the base 40 rests on a ground, the rods 40L can extend underground and be buried in the ground (earth) to stabilize the base 40.

In this example, each bracket structure 31, 32 has six brackets 311B, 32B, so that the support structure 31, 32 can support any number, from one to six, of the lighting devices 10. The support structure 30 supports each of the lighting devices 10 in a vertical orientation. Therefore, the LEDs 31 are oriented sideways such that light emitted from the LEDs 11 propagates generally (substantially, primarily, mostly) in a horizontal direction. If the lighting devices 10 are supported on at least two radially-opposite brackets, then their light propagates in radially-opposite horizontal directions (where "radially" is with reference to the central vertical axis A). If all six brackets 31B, 32B support lighting devices 10, then light propagates in six horizontal directions that are uniformly and circumferentially spaced-apart and project radially-outward away from the central axis A.

FIG. 11 shows an example arrangement of an array of lighting apparatuses 51, each like the lighting apparatus 51 of FIGS. 6-10, and an array of plant-growing trays 52. The lighting apparatuses 51 are spaced apart and interspersed among (between) the plant-growing trays 52, on the floor of a non-stacked indoor growing facility. Each tray 52 holds soil 52S, from which one or more plants are growing. Each lighting apparatus 51 in this example holds three lighting devices 10, so that the beams of light from the lighting devices 10 crisscross each other, and bathe each plant stem (stalk) with light from multiple horizontal directions. To maximize amount of light remaining at the level of the plants and to minimize amount of light wasted by diverging above or below the plants, the front cover 22 in this example is transparent as opposed to translucent.

FIG. 12 is a top view (looking downward) of four lighting apparatuses 51, each like the lighting apparatus 51 of FIG. 11 but with six lighting devices 10 each (instead of only three as in FIG. 11). In FIG. 12, beams of light emitted from the lighting devices 10 of the apparatuses 51 are diagrammatically represented as lines with arrows. The light beams crisscross each other and bathe each plant stem of the plant (not shown) with light from multiple horizontal directions.

FIG. 12 shows only four lighting apparatuses 51, whereas the effect would be more pronounced if more than just four apparatuses 51 are used. Also, each light beam is portrayed in FIG. 12 as a narrow line (with arrows) whereas in reality each beam typically widens with distance from the source. Also, the effect would be even more pronounced, and the efficiency (amount of plant growth per electrical watt consumed) would be enhanced, if the walls of the growing facility were reflected (covered with reflective sheet), which would return any unused light (light that bypassed the plants) back toward the plants. This strategy of reflecting walls is inapplicable to overhead lighting, in which light that bypasses the plants is absorbed in (by) the soil, and placing reflectors on the soil would not return the light back toward the plants but instead back toward the overhead lights.

Since the light beams are propagating horizontally (as opposed to vertically), less light falls on the ground than if the lighting devices 10 were mounted overhead.

Additionally, because the light beams are propagating horizontally, the facility's ceiling can be much lower than if the plants were illuminated from overhead lighting fixtures. That is because overhead lighting fixtures need to be significantly higher than the tops of the plants in order for each light beam to sufficiently broaden as it travels downward before reaching the plants. Accordingly, with overhead lighting, plants need significant headspace above them. In contrast, with the present apparatuses 51, each beam broadens while travelling horizontally, so that no headspace is needed above the plants.

For example, the arrangement of apparatuses 51 and plants 52 (FIG. 11) can occupy a crawl space or spaces between stacked shelves with no headspace above the plants. A crawl space might be a crawl space below a floor that is too short for an adult to walk upright, for example less than 4 feet high, or less than 3 feet high.

FIGS. 13-15 show a second lighting apparatus 61. In this apparatus 61, in contrast to the first apparatus 51 of FIGS. 1-12, the lighting devices 10 are all oriented in the same direction. The lighting devices 10 are ganged together by parallel rods 62. Each rod 62 has a series of claw pockets 63 (FIG. 14) that are cut out of the rod material. Each claw pocket 63 of this second apparatus 61 has the same size and shape as pockets in the claws 33U, 33L, 33 of the apparatus 51 of FIGS. 8-10. This second apparatus 61 might be suspended from a ceiling above the plants, for example by cables that extend from the ceiling into holes in the rods.

In operation, a horticulture facility might have both the rods 62 (FIG. 13) suspended from the ceiling and the array of support structures 30 (FIG. 6) resting on the ground. When the plants sprout, a worker can slide the lighting devices 10 into the claw pockets 63 (FIG. 14) of the overhead rods 62. The lighting devices 10 would remain in the overhead rods 62 to illuminate the plants from above during the time period that the plants are young and short. When the plants reach a predetermined height, the worker can slide the lighting devices 10 out of the claw pockets 63 of the overhead rods 62, and slide the lighting devices 10 into the claws 33 of the ground-supported support structure 51 (FIG. 6) to illuminate the plants from the side. For an adult plant with significant stem height, illuminating the plants from the side might be more energy efficient than overhead lighting (as explained above) and provide more light-delivery to the vertical stem than overhead lighting.

In an above example, electricity enters the lighting device through a flexible cable connected to a wall socket. In another example, the device has a rigid electrical power input terminal whose location and orientation are fixed relative to the rear cover and that protrudes from a rear surface of the rear housing. Such rigidly protruding terminals might be in the form of a pair of blades or prongs that are configured to be plugged into a pair of holes of a socket in a plug-in-socket configuration. In this example, each of the six brackets in the upper bracket might have a socket like a wall socket. In that case, each lighting device would be brought into its installed position by simply plugging the lighting device into one of the six sockets on the upper bracket. This plug-in-socket configuration would simplify installation of the lighting device, because a single linear motion of moving the plug into the socket would provide both the electrical connection (to power the lighting device) and physical connection (to hold the lighting device in place).

Possible advantages of the configurations described above might be explained as follows. Photosynthetically active radiation, often abbreviated PAR, designates the spectral range (wave band) of solar radiation from 400 to 700 nanometers that photosynthetic organisms are able to use in the process of photosynthesis. Far-red light (wavelength>700 nm) has long been considered to make a minimal contribution to photosynthesis, due to its poor absorption by leaves and low quantum yield of photosynthesis. In developmental biology, photomorphogenesis is light-mediated development, where plant growth patterns respond to the light spectrum. This is a completely separate process from photosynthesis where light is used as a source of energy. Phytochromes, cryptochromes, and phototropins are photochromic sensory receptors that restrict the photomorphogenic effect of light to the UV-A, UV-B, blue, and red portions of the electromagnetic spectrum. Plants use phytochrome to detect and respond to red and far-red wavelengths. Phytochromes are signaling proteins that promote photomorphogenesis in response to red light and far-red light. Phytochrome is the only known photoreceptor that absorbs light in the red/far red spectrum of light (600-750 nm) specifically and only for photosensory purposes. Phytochromes are proteins with a light absorbing pigment attached called a chromophore. The chromophore is a linear tetrapyrrole called phytochromobilin.

For white LEDs, lower CRI typically has higher efficiency. Having white LEDs with CRI of 75 and less helps improve the LED device efficiency. Having certain radiation intensity from wavelength above 700 nm may help achieve higher net photosynthetic rate through Emerson effect and improve photomorphogenesis impacts on plants.

The components and procedures described above provide examples of elements recited in the claims. They also provide examples of how a person of ordinary skill in the art can make and use the claimed invention. They are described herein to provide enablement and best mode without imposing limitations that are not recited in the claims. In some instances in the above description, a term is followed by a substantially equivalent term or alternative term enclosed in parentheses.

The invention claimed is:

1. A lighting device for supporting plant-growth, comprising:
   a circuit board;
   an LED driver that is directly mounted on a front surface of the circuit board and is powered by a high-voltage alternating-current (AC) driver-input current to output a driver-output current at a stepped driver-output voltage; and a set of LEDs that are directly mounted on the front surface of the circuit board and are powered by the driver-output current, wherein the set includes:
  one or more deep-red LEDs that are powered by the driver output voltage to emit a first number W1 of watts of radiation of a band of deep-red light at 660 nm;
  one or more far-red LEDs that are powered by the driver output voltage to emit a second number W2 of watts of radiation of a band of far-red light at 730 nm; and
  one or more white-light LEDs that are powered by the driver output voltage to emit a third number W3 of watts of radiation of white light having a color rendering index (CRI) of less than 75;
wherein:
  W3 is greater than the sum W1+W2; and
  the circuit board is fixedly positioned in a vertical orientation alongside a plant, for each of the LEDs in the set to be in a sideways orientation to emit the deep-red light, the far-red light and the white light primarily in a horizontal propagation path toward the plant to support growth of the plant.

2. The lighting device of claim 1, wherein the high voltage AC is at least 100 VAC.

3. The lighting device of claim 1, wherein the driver is configured to apply the driver-output voltage to varying numbers of the LEDs in series, such that the number of the in-series LEDs that the output voltage is applied to is adjusted automatically by the driver, during operation of the driver, to match the driver-output voltage.

4. The lighting device of claim 1, wherein the circuit board is a printed circuit board (PCB), and the LEDs are surface-mounted to the PCB.

5. The lighting device of claim 1, wherein at least 3% of all watts of light radiation emitted by the set of LEDs are of light radiation that is at or above 700 nm.

6. The lighting device of claim 5, wherein at least 5% of all watts of light radiation emitted by the set of LEDs are of light radiation that is at or above 700 nm.

7. The lighting device of claim 1, further comprising:
  a rear cover that is fixedly attached to the circuit board;
  the rear cover including a cavity in which the circuit board is located;
  the rear cover further including a front opening through which light from the LEDs propagates out from the cavity; and
  the rear cover containing a forward-facing surface that is located in the cavity and that engages substantially the entirety of the circuit board's rear surface.

8. The lighting device of claim 7, further comprising a rigid light-transmissive front cover that is fixedly attached to the rear cover and extends across the rear cover's front opening.

9. The lighting device of claim 8, wherein the front cover is of glass or fluoropolymer.

10. The lighting device of claim 8, wherein the front cover is transparent.

11. The lighting device of claim 7, wherein the rear cover is of metal and includes heat-dissipation fins extending rearward from the circuit board.

12. The lighting device of claim 1, wherein:
  the circuit board is elongated and has a length extending in a longitudinal direction;
  the set of LEDs includes a plurality of the deep-red LEDs, a plurality of the far-red LEDs and a plurality of the white-light LEDs;
  the set of LEDs are arranged in an array that is elongated in the longitudinal direction;
  at least one of the deep-red LEDs is located between two far-red LEDs and between two white-light LEDs;
  at least one of the far-red LEDs is located between two deep-red LEDs and between two white-light LEDs; and
  at least one of the white-light LEDs is located between two deep-red LEDs and between two far-red LEDs.

13. An apparatus comprising:
  n lighting devices, wherein n is an integer of at least 3, and each lighting device includes:
    an elongated housing;
    an elongated circuit board that is housed in the housing;
    an LED driver that is housed in the housing and is powered by a high-voltage alternating-current (AC) driver-input current to output a driver-output current; and
    a set of LEDs that are directly mounted on a front surface of the circuit board and are powered by the driver-output current, wherein the set includes deep-red LEDs that are powered by the driver output voltage to emit deep-red light at 660 nm, far-red LEDs that are powered by the driver output voltage to emit far-red light at 730 nm, and white-light LEDs that are powered by the driver output voltage to emit white light having a color rendering index (CRI) of less than 75; and
  a support structure that includes n bracket structures that are uniformly and circumferentially spaced-apart about a vertical central axis, wherein
    each of the n bracket structures removably secures a respective one of the n lighting devices in an installed position in which the respective lighting device's housing and circuit board are fixed in a vertically-elongated orientation,
    such that each of the LEDs in the set is fixed in a sideways orientation to emit the deep-red light, the far-red light and the white light primarily in a horizontal propagation path that projects radially-away from the vertical central axis; and
    such that the n horizontal light-propagation paths are uniformly and circumferentially spaced apart about the support structure's vertical central axis.

14. The lighting apparatus of claim 13, wherein each of the n brackets is configured for an elongated component of the respective lighting device to slide downward through the bracket as the respective lighting device moves downward toward and into its installed position.

15. The lighting apparatus of claim 14, wherein the elongated component of the lighting device comprises one or more heat-dissipation fins.

16. The lighting apparatus of claim 15, wherein the support structure has a base, and the base has a bottom surface that rests on the ground and one or more rods that extend from the base's bottom surface to a location underground to stabilize the base relative to the ground.

17. The lighting apparatus of claim 16, wherein the driver is configured to automatically adjust the number of LEDs that are powered by the driver, so that the number of LEDs that the driver's output voltage is being applied to is automatically adjusted by the driver to be appropriate for a voltage level of the driver-output current.

18. The lighting apparatus of claim 17, wherein each of the n horizontal propagation paths projects radially-away from the vertical central axis and toward a stem of a plant that is growing in an indoor horticultural facility.

19. The lighting apparatus of claim 18, wherein
the deep-red LEDs are powered by the driver output voltage to emit a first number W1 of watts of radiation of a band of deep-red light at 660 nm;
the far-red LEDs are powered by the driver output voltage to emit a second number W2 of watts of radiation of a band of far-red light at 730 nm; and
the white-light LEDs are powered by the driver output voltage to emit a third number W3 of watts of radiation of white light having a color rendering index (CRI) of less than 75;
W3 is greater than the sum W1+W2; and
wherein at least 3% of all radiation output by the set of LEDs is at or above 700 nm.

20. The lighting apparatus of claim 1, wherein the LEDs are emitting the deep-red light, the far-red light and the white light primarily in a horizontal propagation path toward a stem of the plant.

\* \* \* \* \*